US011468951B2

(12) United States Patent
Nie et al.

(10) Patent No.: US 11,468,951 B2
(45) Date of Patent: Oct. 11, 2022

(54) METHOD FOR PROGRAMMING FLASH MEMORY

(71) Applicant: CHINA FLASH CO., LTD., Shanghai (CN)

(72) Inventors: Hong Nie, Shanghai (CN); Jingwei Chen, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 0 days.

(21) Appl. No.: 17/458,186

(22) Filed: Aug. 26, 2021

(65) Prior Publication Data

US 2022/0084599 A1    Mar. 17, 2022

(30) Foreign Application Priority Data

Sep. 11, 2020 (CN) .......................... 202010954474.5

(51) Int. Cl.
| | |
|---|---|
| *G11C 16/04* | (2006.01) |
| *G11C 16/10* | (2006.01) |
| *G11C 16/14* | (2006.01) |
| *H01L 27/11521* | (2017.01) |
| *H01L 29/788* | (2006.01) |

(52) U.S. Cl.
CPC .......... *G11C 16/10* (2013.01); *G11C 16/0408* (2013.01); *G11C 16/14* (2013.01); *H01L 27/11521* (2013.01); *H01L 29/7881* (2013.01); *G11C 16/0425* (2013.01)

(58) Field of Classification Search
CPC .................................................. G11C 16/0425
USPC ..................................................... 365/185.14
See application file for complete search history.

(56) References Cited

U.S. PATENT DOCUMENTS

| | | | |
|---|---|---|---|
| 6,620,682 B1 * | 9/2003 | Lee ..................... | G11C 16/0416 438/257 |
| 2007/0081394 A1 | 4/2007 | Kuoi et al. | |
| 2008/0026696 A1 | 1/2008 | Choi et al. | |

FOREIGN PATENT DOCUMENTS

CN             103137775 A      6/2013

* cited by examiner

*Primary Examiner* — Jason Lappas
(74) *Attorney, Agent, or Firm* — Tianhua Gu; Global IP Services

(57) ABSTRACT

The present disclosure relates to a method for programming flash memory, which includes: providing a flash memory structure having a floating gate, and floating a source of the flash memory structure; separately applying voltages to a drain and a substrate, to form an electric field, and generating electron-hole pairs, to generate primary electrons, where the voltage applied to the substrate is less than the voltage applied to the drain; accelerating holes downward under the action of the electric field to collide with the substrate in the flash memory structure within a preset time, to generate secondary electrons; and separately applying voltages to a gate and the substrate, where the voltage applied to the substrate is less than the voltage applied to the gate, and enabling the secondary electrons to generate tertiary electrons to inject the tertiary electrons into the floating gate, to complete a programming operation.

8 Claims, 5 Drawing Sheets

METHOD FOR PROGRAMMING FLASH MEMORY

TECHNICAL FIELD

The present disclosure relates to the field of memory, in particular, to a method for programming flash memory.

BACKGROUND

Non-volatile memories (NVMs) are applied widely in semiconductor devices. A characteristic of an NVM is that it can save stored data even after it is powered off. The earliest NVM is erasable programmable read-only memory (EPROM). EPROM uses hot carrier injection (HCI) for programming and uses ultraviolet (UV) light for erasure. However, such devices require quartz glass for UV light erasure, resulting in high costs.

To reduce manufacturing costs, electrically erasable programmable read-only memory (EEPROM) that adopts the Fowler-Nordheim (FN) Tunneling effect to perform electrical erasure was invented. In EEPROM, when electrons are injected and stored in a floating gate, it indicates that information "0" is stored; when electrons are erased from the floating gate, it indicates that information "1" is stored. EEPROM requires lower costs than EPROM, but EEPROM has a disadvantage that its programming and erasure need to be performed byte by byte, resulting in a slow speed.

To increase the read speed, the circuit design of EEPROM devices was further improved, so that programming and erasure can be performed on multiple memory cells at the same time. This kind of improved EEPROM is what now commonly known as the Flash EEPROM (or Flash for short).

At present, flash memory has been widely utilized in various kinds of storage mediums (for example, smart cards and storage cards) and is an important semiconductor component. The most classic flash memory is EEPROM with tunnel oxide (ETOX), which uses HCI for programming.

Because of the physical mechanism of HCI, generated hot electrons are injected based on the Lucky Electron model, whose programming efficiency is relatively low (about 50% in general). Therefore, a higher voltage is needed to improve the programming efficiency, which however leads to high power consumption of the corresponding flash memory device. In addition, because the Punch Through effect is inherent in the Hot Electron effect, when the gate length of the flash memory is less than 110 nanometers, the Punch Through effect is likely to occur, restricting further miniaturization of the device.

To overcome the above-mentioned shortcomings, NXP Semiconductors N.V. invented a 2 T flash memory which is programmed based on the FN Tunneling effect. Hsu et al. invented a P-type channel flash memory, which adopts band-to-band tunneling (BTBT) for programming. However, because these devices mainly take advantage of quantum tunneling, which is physical, they have a relatively low read current for programming, and these programming methods may inflict considerable damage on the tunnel oxide layers of the devices, thereby posing a challenge to the reliability of these flash memory devices.

Thus, to come up with a method for programming flash memory that has a high programming efficiency, low power consumption, and large read current for programming, one that does not hinder further miniaturization of the device, has becomes an urgent problem facing those skilled in the art.

SUMMARY

In view of the shortcomings in the prior art, the present disclosure provides a method for programming flash memory, in order to resolve problems, for example, that the programming methods in the prior art have low programming efficiency, high power consumption, and a small read current for programming, that the prior art methods prevent further miniaturization of the device, and that they inflict severe damage on the device's tunnel oxide layer.

Thus, the present disclosure provides a method for programming a flash memory, which includes:

S1) providing a flash memory structure with a floating gate, and floating a source of the flash memory structure;

S2) separately applying voltages to a drain and a substrate of the flash memory structure, to form an electric field, generating electron-hole pairs, generating primary electrons, with the voltage applied to the substrate less than the voltage applied to the drain;

S3) accelerating holes downward under the action of the electric field to collide with the substrate in the flash memory structure within a preset time, to generate secondary electrons; and S4) separately applying voltages to a gate and the substrate of the flash memory structure, with the voltage applied to the substrate less than the voltage applied to the gate, and enabling the secondary electrons to generate tertiary electrons under the action of a vertical electric field to inject the tertiary electrons into the floating gate of the flash memory structure, to complete a programming operation.

Optionally, the flash memory structure comprises an ETOX structure, a 1.5 T structure, a 2 T structure, or an EEPROM structure.

Optionally, the difference between the voltage applied to the drain and the voltage applied to the substrate in operation S2) is not less than 4 V.

Optionally, the preset time in operation S3) is from 10 ns to 100 ns.

Optionally, the difference between the voltage applied to the gate and the voltage applied to the substrate in operation S4) is not less than 7 V.

Optionally, before operation S1), the method further comprises: pre-erasing the flash memory structure to eliminate residual charges in the floating gate.

Optionally, the method of the pre-erasing further comprises: separately applying voltages to the gate and the substrate of the flash memory structure, with the voltage applied to the substrate higher than the voltage applied to the gate.

Optionally, the difference between the voltage applied to the gate and the voltage applied to the substrate is not less than 10 V.

As discussed above, the method for programming a flash memory according to the present disclosure has the following beneficial effects:

In the method for programming flash memory according to the present disclosure, by improving and optimizing the operations of programming voltage, tertiary electron excitation is triggered to perform programming, so that the programming efficiency of the flash memory can be improved, power consumption can be reduced, the read current for programming can be increased, and the device's tunnel oxide layer will only be subject to minor damage. In addition, the Punch Through effect can be prevented, thereby facilitating further miniaturization of the flash memory.

REFERENCE NUMERALS

Figure 1:
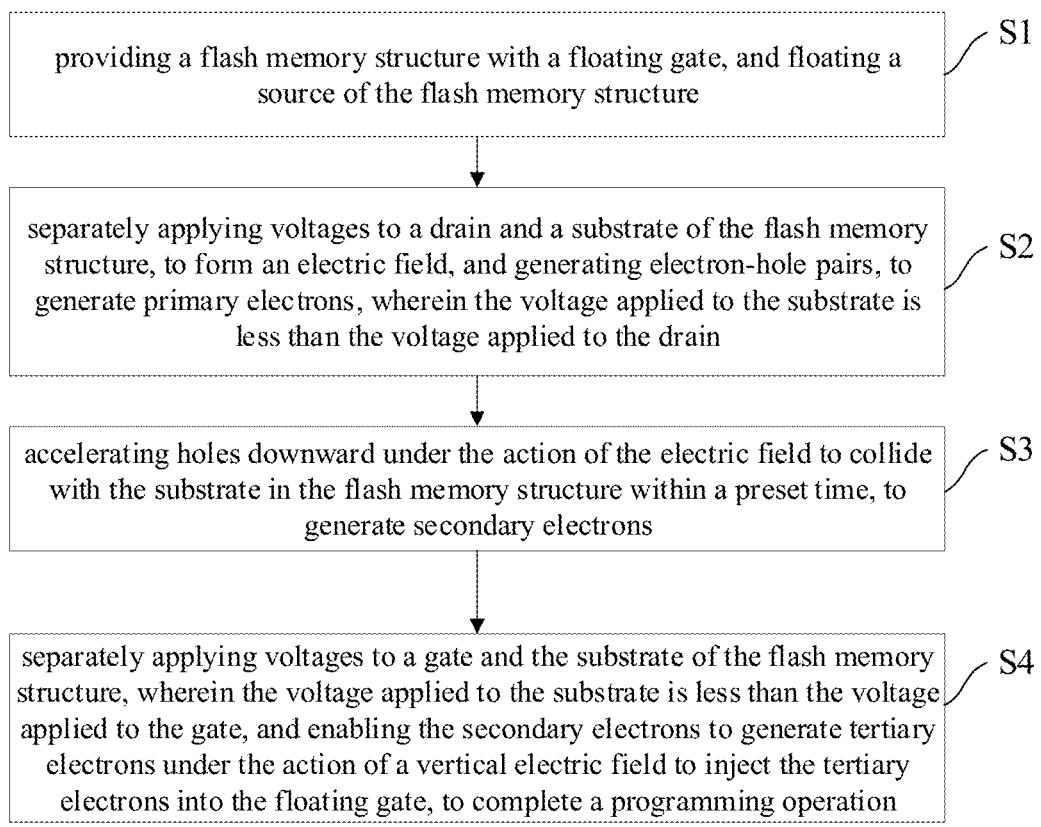
FIG. 1 is a schematic flowchart of a method for programming flash memory according to the present disclosure.

1-Substrate region;
2-Source region;
3-Drain region;
4-Tunnel oxide layer;
5-Floating gate;
6-Dielectric oxide layer;
7-Control gate; and
S1 to S4-Various Operations.

DETAILED DESCRIPTION

The implementations of the present disclosure are described below through specific embodiments. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 1 to FIG. 8. It should be noted that the drawings provided in this embodiment only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complex.

As shown in FIG. 1, the present disclosure provides a method for programming flash memory, which comprises the following operations S1, S2, S3 and S4:

Operation S1) Provide a flash memory structure with a floating gate, and float a source of the flash memory structure.

Figure 2:
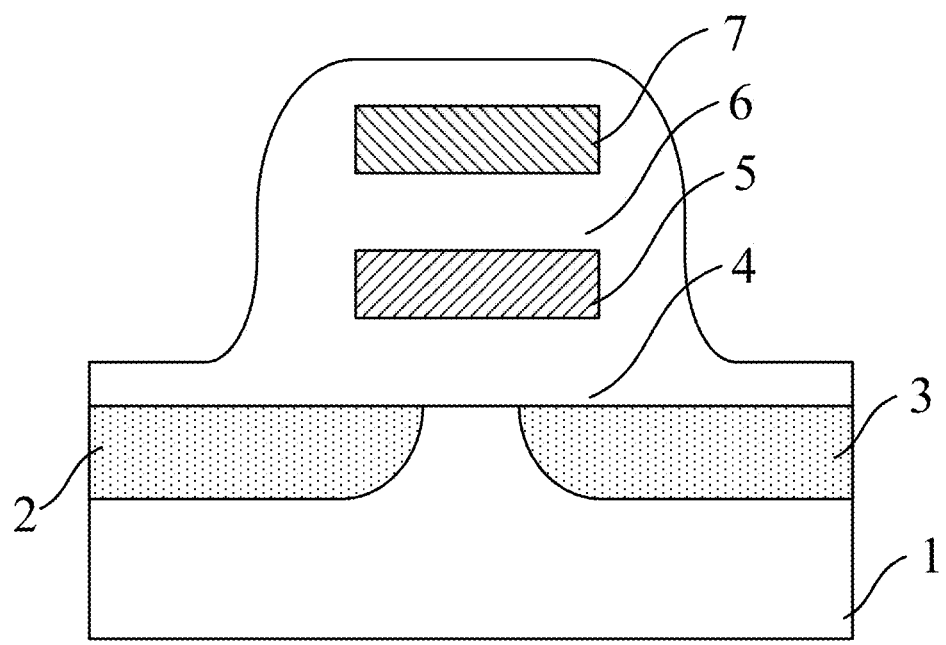
FIG. 2 is a schematic diagram of flash memory with an ETOX structure.

Specifically, a flash memory structure, which may be a flash memory cell or a flash memory unit, is provided. The flash memory structure has a floating gate. The flash memory structure comprises, but is not limited to, an ETOX structure (e.g., a 1 T structure), a 1.5 T structure (e.g., a split gate structure), a 2 T structure, or an EEPROM structure, some of which may not be illustrated and listed one by one herein. The ETOX structure is used as an example in this embodiment. As shown in FIG. 2, a ETOX structure comprises a substrate region 1, a source region 2 and a drain region 3, the source region 2 and the drain region 3 may be formed within the substrate region 1. The ETOX structure may further include a tunnel oxide layer 4, a floating gate 5, a dielectric oxide layer 6, and a control gate 7, all of which are sequentially formed above the substrate region 1. In this embodiment, the substrate region 1 is a P-type substrate, and the source region 2 and the drain region 3 are N-type doped regions.

It should be noted that any flash memory structure with a floating gate is applicable to the method for programming flash memory according to the present disclosure. The present disclosure is not limited to the ETOX structure shown in this embodiment.

Figure 3:
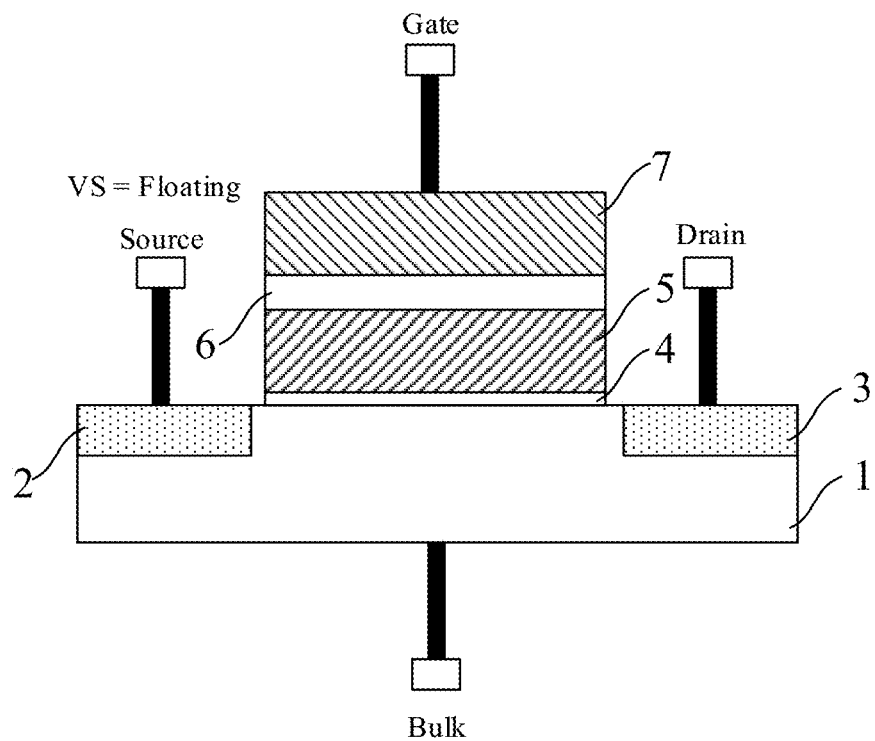
FIG. 3 is a schematic diagram of an operation of floating a source in a method for programming flash memory according to the present disclosure.

Specifically, as shown in FIG. 3, during programming of the flash memory structure, the source of the flash memory structure is floated (in this case, a voltage VS on the source is considered as floating). No voltage is applied to the source during programming, and no electric field is generated, so that the Punch Through effect can be avoided. Therefore, the gate length of the flash memory structure may be manufactured to be less than 110 nm, to further miniaturize the flash memory structure.

Figure 4:
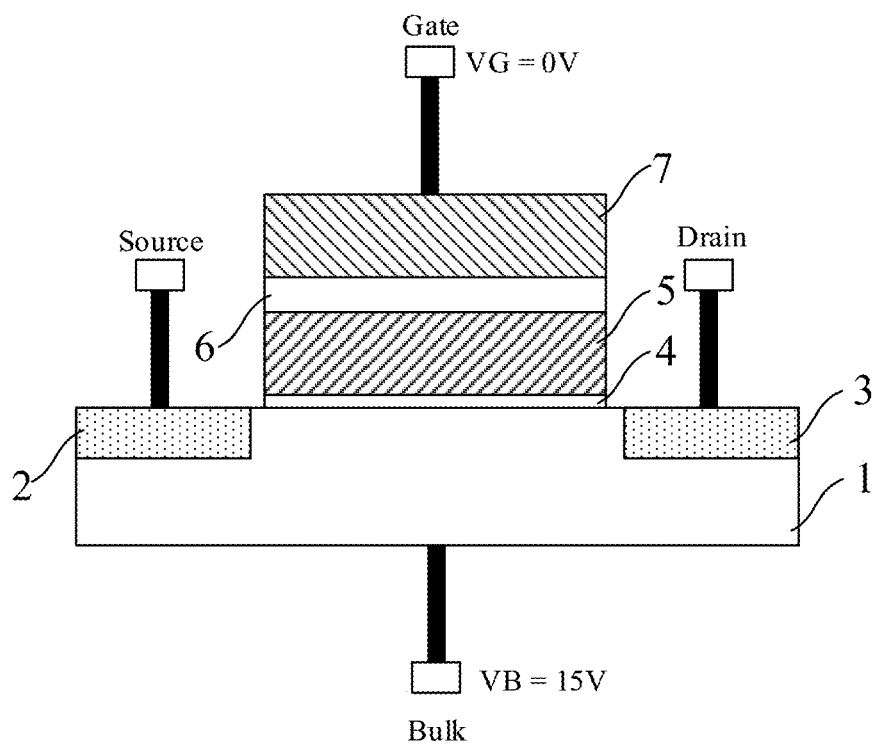
FIG. 4 is a schematic diagram illustrating the pre-erasure operation in a method for programming flash memory according to the present disclosure.

In another implementation of the present disclosure, before operation S1) is performed, the method further comprises: pre-erasing the flash memory structure to eliminate residual charges in the floating gate 5. Due to the manufacturing process, environmental static electricity, or charges, may accumulate in the floating gate 5. Therefore, before operation S1) is performed, pre-erasure may be performed first, to eliminate the influence of the residual charges on subsequent operations. Specifically, as shown in FIG. 4, voltages are separately applied to the gate and a substrate of the flash memory structure. A voltage VB applied to the substrate is higher than a voltage VG applied to the gate. In an example, the difference between the voltage applied to the gate and the voltage applied to the substrate is not less than 10 V. Optionally, the voltage VB applied to the substrate is about 15 V, and the voltage VG applied to the gate is about 0 V. During actual use, the voltage values of VB and VG and the voltage difference between the voltages (including, but not limited to, VB=10 V, and VG=−5 V; or, VB=8 V, and VG=−1 V) may be set as required, provided that the influence of the residual charges in the floating gate 5 on subsequent operations can be eliminated. This embodiment is not limited thereto.

It should be noted that, provided that the residual charges in the floating gate 5 do not affect subsequent operations, the operation of pre-erasure can be eliminated. This embodiment is not limited thereto. In addition, any method that can implement pre-erasure is applicable to the present disclosure, without limiting.

Operation S2) Separately apply voltages to a drain and a substrate of the flash memory structure, to form an electric field, which may generate electron-hole pairs and generate primary electrons, where the voltage applied to the substrate is less than the voltage applied to the drain, and the difference between the voltage applied to the drain and the voltage applied to the substrate is not less than 10 V.

Figure 5:
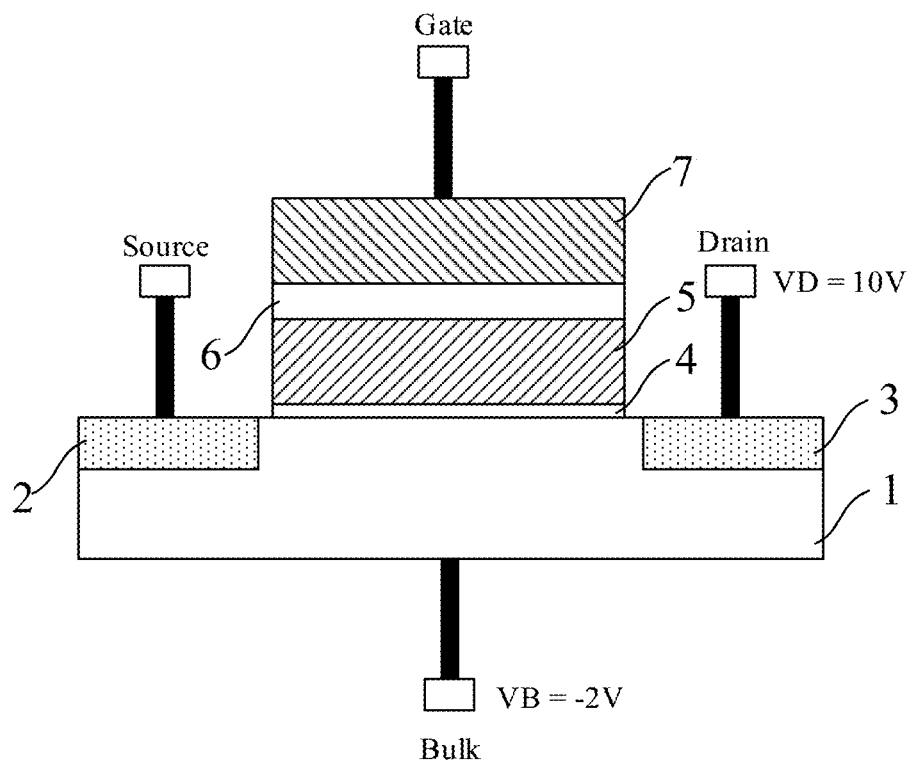
FIG. 5 is a schematic diagram illustrating the operation of generating primary electrons in a method for programming flash memory according to the present disclosure.

Specifically, as shown in FIG. 5, a voltage VD is applied to the drain of the flash memory structure, the voltage VB is applied to the substrate of the flash memory structure, and a voltage difference that exists between the drain and the substrate of the flash memory structure results in the electric field. In an example, the difference between the voltage applied to the drain and the voltage applied to the substrate is not less than 4 V (including, but not limited to, 4.3 V, 5 V, 6 V, 7 V, or 8 V). Optionally, the voltage VB applied to the substrate is set to about −2 V, and the voltage VD applied to the drain is set to about 10 V. During actual use, the voltage values of VB and VD and the voltage difference between the voltages (including, but not limited to, VB=−2 V, and VG=4.5 V; or VB=0 V, and VG=6 V) may be set according to actual requirements, provided that a strong electric field can be generated to obtain electron-hole pairs. This embodiment is not limited thereto.

Operation S3) Accelerate holes downward under the action of the electric field to collide with the substrate in the flash memory structure within a preset time, to generate secondary electrons.

Specifically, in an example, the preset time is set to about 10 ns to 100 ns. During actual use, the preset time may be adjusted based on factors such as the electric field, provided that the secondary electrons required in the present disclosure can be generated. This embodiment is not limited thereto.

Specifically, within the preset time, the heavily-accelerated holes may collide with the substrate, which may in turn generate relatively light electrons, that is, the secondary electrons.

Operation S4) Separately apply voltages to a gate and the substrate of the flash memory structure, where the voltage applied to the substrate is less than the voltage applied to the gate, and enable the secondary electrons to generate tertiary electrons under the action of a vertical electric field to inject the tertiary electrons into the floating gate 5 of the flash memory structure, to complete a programming operation.

Figure 6:
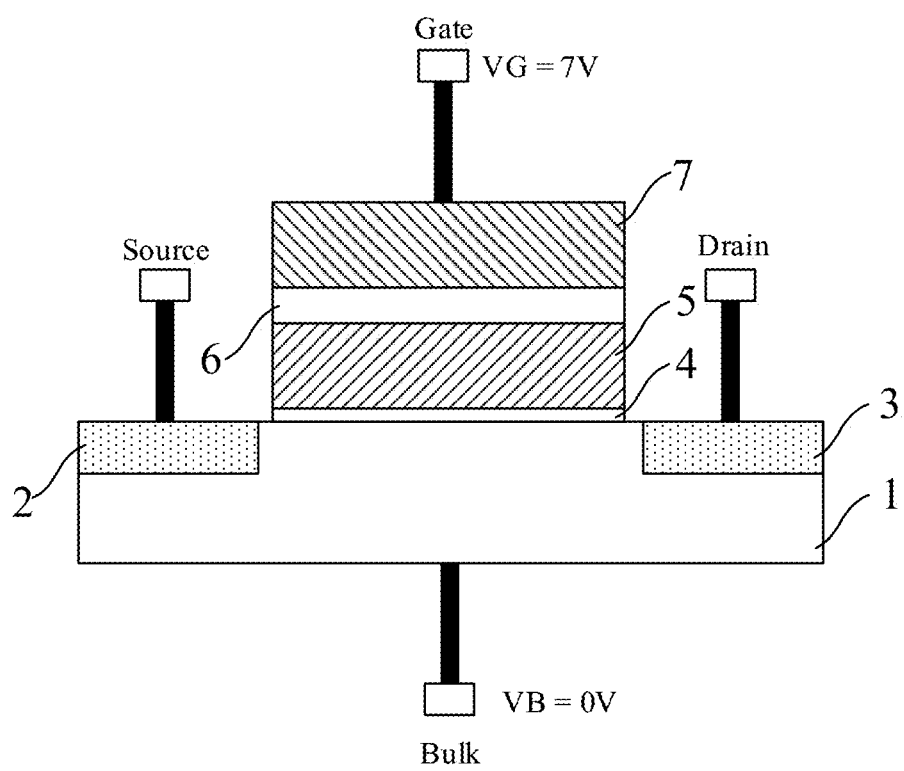
FIG. 6 is a schematic diagram illustrating the operation where tertiary electrons enter a floating gate in a method for programming flash memory according to the present disclosure.

Specifically, as shown in FIG. 6, the voltage VG is applied to the gate of the flash memory structure, the voltage VB is applied to the substrate of the flash memory structure, and a voltage difference that exists between the gate and the substrate of the flash memory structure results in the vertical electric field. In an example, the difference between the voltage applied to the gate and the voltage applied to the substrate is more (not less) than 7 V. Optionally, the voltage VB applied to the substrate is set to about 0 V, and the voltage VG applied to the gate is set to about 7 V. During actual use, the voltage values of VB and VG and the voltage difference between the voltages (comprising, but not limited to, VB=0 V, and VG=6 V) may be set according to actual requirements, provided that the electrons can obtain sufficient kinetic energy to overcome a Si-Oxide energy barrier and pass through the tunnel oxide layer 4 to enter the floating gate 5. This embodiment is not limited thereto.

Figure 7:
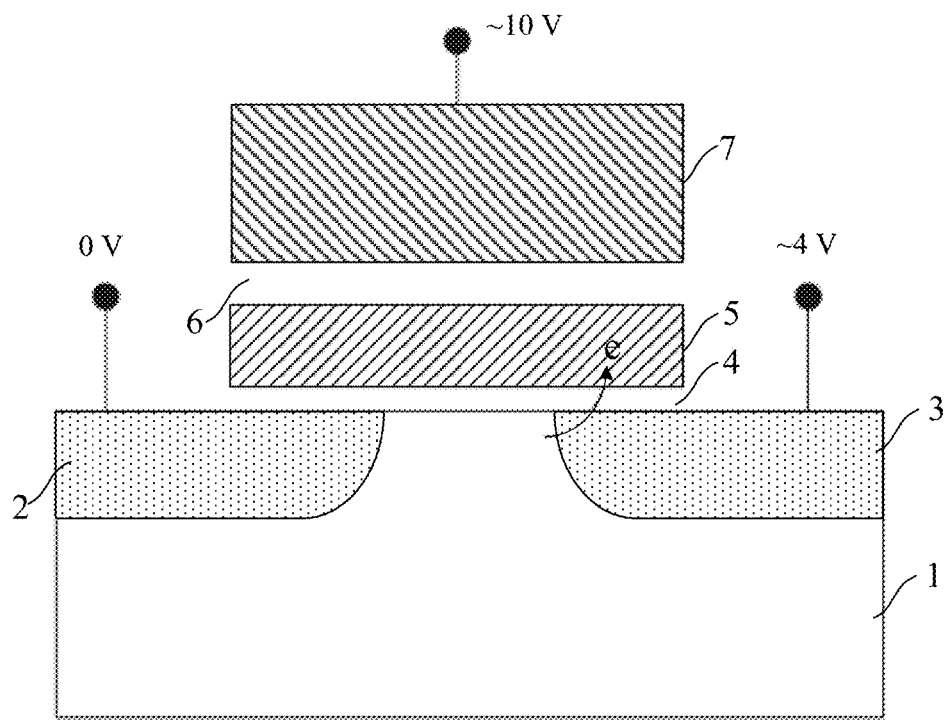
FIG. 7 is a schematic diagram of a programming principle of an existing ETOX structure.

As shown in FIG. 7, an ETOX structure uses an HCI manner for programming. Charges are stored in a floating gate. A voltage is applied to a control gate. During programming, a voltage is applied to a drain to generate hot electrons (represented by "e"). A voltage is then applied to a gate, and a voltage is coupled to the floating gate through a dielectric oxide layer. A potential is generated to help the electrons break through the energy barrier to be injected into the floating gate through a tunnel oxide layer, to complete programming. Such ETOX structure may have shortcomings such as low programming efficiency, high power consumption, and may lead to Punch Through effect.

Figure 8:
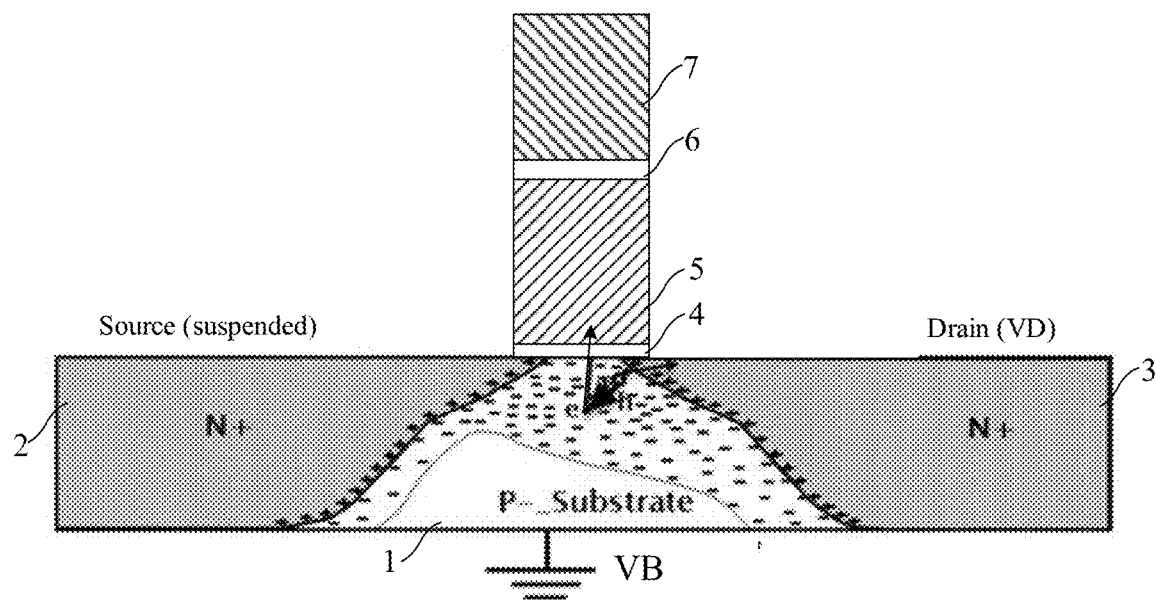
FIG. 8 is a schematic diagram of the principle of a method for programming flash memory according to the present disclosure.

As shown in FIG. 8, in the method for programming flash memory according to the present disclosure, a lateral electric field is first generated, which in turn generates electron-hole pairs. Primary electrons are generated and then move toward a drain. Next, the primary electrons collide with a side wall of a drain region to accelerate holes downward to collide with a substrate to generate secondary electrons. Finally, a voltage is applied to a gate to enable the secondary electrons to generate tertiary electrons under the action of a vertical electric field to inject the tertiary electrons into a floating gate, to complete a programming operation.

The method for programming flash memory according to the present disclosure is based on tertiary electron collision. The lateral and vertical electric fields are simultaneously formed. Tertiary electron excitation is used to perform programming. The tertiary electrons enter the floating gate in a vertical manner in the vertical electric field, so that programming efficiency can be improved, power consumption can be reduced, its read current for programming is increased, and the tunnel oxide layer is only subject to minor damage. In addition, during programming, the source remains in a floating state, so that the Punch Through effect can be prevented, which facilitates further miniaturization of flash memory.

In summary, the present disclosure provides a method for programming flash memory, comprising: providing a flash memory structure having a floating gate, and floating a source of the flash memory structure; separately applying voltages to a drain and a substrate of the flash memory structure, to form an electric field, and generating electron-hole pairs, to generate primary electrons, where the voltage applied to the substrate is less than the voltage applied to the drain; accelerating holes downward under the action of the electric field to collide with the substrate in the flash memory structure within a preset time, to generate secondary electrons; and separately applying voltages to a gate and the substrate of the flash memory structure, where the voltage applied to the substrate is less than the voltage applied to the gate, and enabling the secondary electrons to generate tertiary electrons under the action of a vertical electric field to inject the tertiary electrons into the floating gate of the flash memory structure, to complete a programming operation.

In the method for programming flash memory according to the present disclosure, a programming voltage operation manner is improved and optimized, to trigger tertiary electron excitation to perform programming, so that programming efficiency can be improved, power consumption can be reduced, the read current for programming is high, and the tunnel oxide layer is only subject to minor damage. In addition, the Punch Through effect can be prevented, to facilitate further miniaturization of flash memory. Therefore, the present disclosure effectively overcomes various shortcomings in the prior art, and has a high industrial value.

The above embodiments only exemplarily describe the principles and effects of the present disclosure, but are not used to limit the present disclosure. Any person skilled in the art may make modifications or changes to the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method for programming flash memory, at least comprising:
   - a first step: providing a flash memory structure with a floating gate, and floating a source of the flash memory structure;
   - a second step: after the first step, separately applying voltages to a drain and a substrate of the flash memory structure, to form a lateral electric field, generate electron-hole pairs, and generate primary electrons, wherein the voltage applied to the substrate is less than the voltage applied to the drain;
   - a third step: after the second step, accelerating holes downward under the action of the lateral electric field to collide with the substrate in the flash memory structure within a preset time, to generate secondary electrons; and
   - a fourth step: after the third step, separately applying second voltages to a gate and the substrate of the flash memory structure, to form a vertical electric field, wherein the voltage applied to the substrate is less than the voltage applied to the gate, and enabling the secondary electrons to generate tertiary electrons under the action of the vertical electric field, wherein the vertical electric field then injects the tertiary electrons into the floating gate of the flash memory structure, to complete a programming operation of the flash memory structure.

2. The method for programming flash memory as in claim 1, wherein
   the flash memory structure comprises an electrically erasable programmable read-only memory (EEPROM) with tunnel oxide (ETOX) structure, a 1.5 T structure, a 2 T structure, or an EEPROM structure.

3. The method for programming flash memory as in claim 1, wherein
   a difference between the voltage applied to the drain and the voltage applied to the substrate in the second step is not less than 4 V.

4. The method for programming flash memory as in claim 1, wherein
   the preset time in the third step is from 10 ns to 100 ns.

5. The method for programming flash memory as in claim 1, wherein
   a difference between the voltage applied to the gate and the voltage applied to the substrate in the fourth step is not less than 7 V.

6. The method for programming flash memory as in claim 1, before the first step, further comprising:
   pre-erasing the flash memory structure to eliminate residual charges in the floating gate.

7. The method for programming flash memory as in claim 6, wherein the pre-erasing comprises:
   separately applying voltages to the gate and the substrate of the flash memory structure, wherein the voltage applied to the substrate is higher than the voltage applied to the gate.

8. The method for programming flash memory as in claim 7, wherein
   a difference between the voltage applied to the gate and the voltage applied to the substrate is not less than 10 V.

* * * * *